United States Patent
Ziger

(10) Patent No.: US 7,790,480 B2
(45) Date of Patent: Sep. 7, 2010

(54) METHOD FOR DETERMINING RELATIVE SWING CURVE AMPLITUDE

(75) Inventor: David Ziger, San Antonio, TX (US)

(73) Assignee: NXP B.V., Eindhoven (NL)

( * ) Notice: Subject to any disclaimer, the term of this patent is extended or adjusted under 35 U.S.C. 154(b) by 505 days.

(21) Appl. No.: 10/576,552

(22) PCT Filed: Oct. 19, 2004

(86) PCT No.: PCT/IB2004/052145

§ 371 (c)(1),
(2), (4) Date: Dec. 19, 2008

(87) PCT Pub. No.: WO2005/038529

PCT Pub. Date: Apr. 28, 2005

(65) Prior Publication Data

US 2009/0119069 A1    May 7, 2009

Related U.S. Application Data

(60) Provisional application No. 60/512,744, filed on Oct. 20, 2003.

(51) Int. Cl.
*H01L 21/66* (2006.01)
(52) U.S. Cl. .............. 438/16; 438/14; 430/22; 430/30; 356/300; 356/320; 356/346; 356/485; 356/503; 356/630; 118/663; 118/664; 118/688; 118/712

(58) Field of Classification Search ............. None
See application file for complete search history.

(56) References Cited

U.S. PATENT DOCUMENTS 5,982,496 A * 11/1999 Ziger ................ 356/630

FOREIGN PATENT DOCUMENTS

WO    WO 2005/015312    2/2005

OTHER PUBLICATIONS

Schiltz et al. ("Concept of two-dimensional swing curves for critical dimension prediction and optimization of resist/antireflective coating bilayers in topographic situations", Opt. Eng., 39(3), pp. 776-786, 2000).*

* cited by examiner

*Primary Examiner*—Charles D Garber
*Assistant Examiner*—Yasser A Abdelaziez
(74) *Attorney, Agent, or Firm*—Peter Zawilski

(57) ABSTRACT

A process (300) is disclosed to measure predetermined wavelength reflectance spectra of a photo resist coated wafer (305, 310, 315, 320) at a nominal thickness. After coating, the predetermined wavelength reflectance (325, 330) is measured and the peak heights and valleys in the vicinity of the predetermined wavelength are tabulated. The relative swing ratio is computed (335) as the average peak height of the spectra at the exposure wavelength. This relative swing ratio is then compared to similar computations on other processes to determine which provides the best critical dimension (CD) control.

15 Claims, 3 Drawing Sheets

METHOD FOR DETERMINING RELATIVE SWING CURVE AMPLITUDE

CROSS REFERENCE TO RELATED APPLICATION

This application claims the benefit of U.S. provisional application Ser. No. 60/512,744 filed Oct. 20, 2003, which is incorporated herein whole by reference.

This application claims priority from provisional U.S. Application titled, "System and Method to Determine Optimal Resist Thickness and Compare Swing Curve Amplitudes" (Application Ser. No. 60/493,698) filed on Aug. 8, 2003. Furthermore the present application is related to provisional U.S. Application titled, "Method for Determining Optimal Resist Thickness" (Ser. No. 60/512,717), filed concurrently. Both applications are incorporated by reference in their entirety.

The invention relates generally to semiconductor fabrication and more particularly to a field of determining an approximate critical dimension (CD) for wafer processing using swing curves Most semiconductor devices are fabricated by coating thin layers, or films, of photosensitive materials, known as photo resist, onto various semiconductor substrates. These thin layers of photo resist are thereafter typically exposed to ultraviolet (UV) radiation to induce chemical reactions therein. The chemical reactions create regions that are either base insoluble or base soluble in dependence upon whether a particular portion of the photo resist has been exposed to the UV radiation or not. Since these photo resist films are on the same order of thickness as an actinic radiation, which is an exposure wavelength used for inducing of the chemical reactions in the photo resist, the amount of light coupled into the resist is very dependent on the thickness of photo resist. The effect of photo resist thickness on a line width of the radiation source is known as the "swing curve" effect. Generally, the swing curve effect is represented as a sinusoidal function. It is very desirable to operate semiconductor processes that offer minimal line width variation due to the swing curve effects so as to obtain uniformity in the semiconductor devices by providing nearly the same critical dimensions (CDs) from semiconductor device to device.

There are several methods that are used to determine the swing curve. The first method is to coat varying resist thickness levels on a number of wafers, such as silicon substrate wafers. Then to measure the resist thickness on each wafer, expose each wafer to a radiation source and to develop each of the wafers. After development, a particular feature (a CD feature) is measured on all the wafers and this measurement is tabulated or plotted as a function of resist thickness. The plotting of this curve generally results in a sinusoidal curve. A second method is to expose a pattern (of varying thicknesses) of increasing exposure doses on wafers of varying thicknesses and record the dose for each wafer at which the resist clears or has the same optically measured thickness. Optionally, in order to induce varying thickness across a same wafer, the wafer is selectively etched so that after coating and etching there is a variation of resist thicknesses across the wafer. A wafer of this type is known as a topography wafer. The wafer is exposed, developed and resist thickness in predetermined regions is measured. Line width, or dose-to-clear measurements, are compared to the resist thicknesses before exposure. Lastly, modeling of the swing effect based on physical or measured parameters is another option. For example, PROLITH (KLA/TENCOR) allows for calculation of the swing curve.

There are challenges to all these approaches. The most common method that is utilized is to prepare wafers of varying resist thicknesses. However, this is a very labor-intensive process and the resulting metric, dose to clear, or line width, versus resist thickness often may vary from wafer to wafer due to other process variations. The single wafer approach requires that a special topography wafer be fabricated which may not be representative of normal processing or easy to accomplish for particular films.

Another approach is modeling. Modeling is generally much easier to do than measuring the swing curve but it requires knowledge of many optical and physical parameters, such as refractive index. Generally, a useful approach is to measure the swing curve on a simple substrate so that realistic parameters can be extracted. Thereafter, the swing effect on more complicated substrates can be modeled.

There exists a need to provide a method of determining relative swing curve amplitudes for the three swing curve determination techniques. The present invention provides a method for comparing swing curve amplitudes between competing processes using UV reflectance spectroscopy to determine which provides optimal critical dimension (CD) control.

In an example embodiment, there is a method of determining relative swing curve amplitudes for a plurality of wafer processes. The steps comprise coating a first wafer with a first photo resist having a first thickness in accordance with a first process. A second wafer is coated with a second photo resist having a second thickness in accordance with a second process, the second photo resist for providing different a top antireflective coating at an actinic wavelength. The first coated wafer is exposed to the actinic wavelength and the second coated wafer is exposed to the actinic wavelength. A first reflectance of the first photo resist within a predetermined range of the actinic wavelength is sensed to determine first peak height data and first valley data. A second reflectance of the second photo resist within a predetermined range of the actinic wavelength is sensed to determine second peak height data and second valley data. A value relating to CD as a function of the first peak height data, the first valley data, the second peak height data and the second valley data is then determined.

In another example embodiment, there is a method of determining relative swing curve amplitudes for a plurality of wafer processes. The method comprises the steps of coating a first wafer with a first photo resist having a first thickness in accordance with a first process. A second wafer is coated with a second photo resist having a second thickness in accordance with a second process, the second photo resist for providing different optical characteristics that the first photo resist at an actinic wavelength. The first coated wafer is exposed to the actinic wavelength. The second coated wafer is exposed to the actinic wavelength. A first reflectance of the first photo resist within a predetermined range of the actinic wavelength is sensed to determine first peak height data and first valley data. A second reflectance of the second photo resist within a predetermined range of the actinic wavelength is sensed to determine second peak height data and second valley data. A relative swing ratio for the first and second processes in dependence upon the first peak height data, the first valley data, the second peak height data and the second valley data is then determined.

In yet another embodiment, there is a plurality of wafers manufactured in accordance with a method that comprises, coating a first wafer with a first photoresist having a first thickness in accordance with a first process. A second wafer with a second photoresist having a second thickness in accordance with a second process is coated. The second photoresist for providing a different a top antireflective coating at an actinic wavelength. The first and second coated wafers are exposed to the actinic wavelength. A first reflectance is sensed of the first photo resist within a predetermined range of the actinic wavelength to determine first peak height data and first valley data. A second reflectance of the second photoresist is sensed within a predetermined range of the actinic wavelength to determine second peak height data and second valley data. A value relating to CD as a function of the first peak height data, the first valley data, the second peak height data and the second valley data is then determined.

The above summaries of the present invention are not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which.

The present invention has been found to be useful in measuring the UV reflectance spectra of a resist coated wafer at a nominal thickness. After coating, the UV reflectance is measured and the peak heights and valleys in the vicinity of the actinic wavelength are tabulated. The relative swing ratio is computed as the average peak height of the spectra at the exposure wavelength. This relative swing ratio can be compared to similar computations on other processes to determine which provides the most control of critical dimensions.

Figure 1:
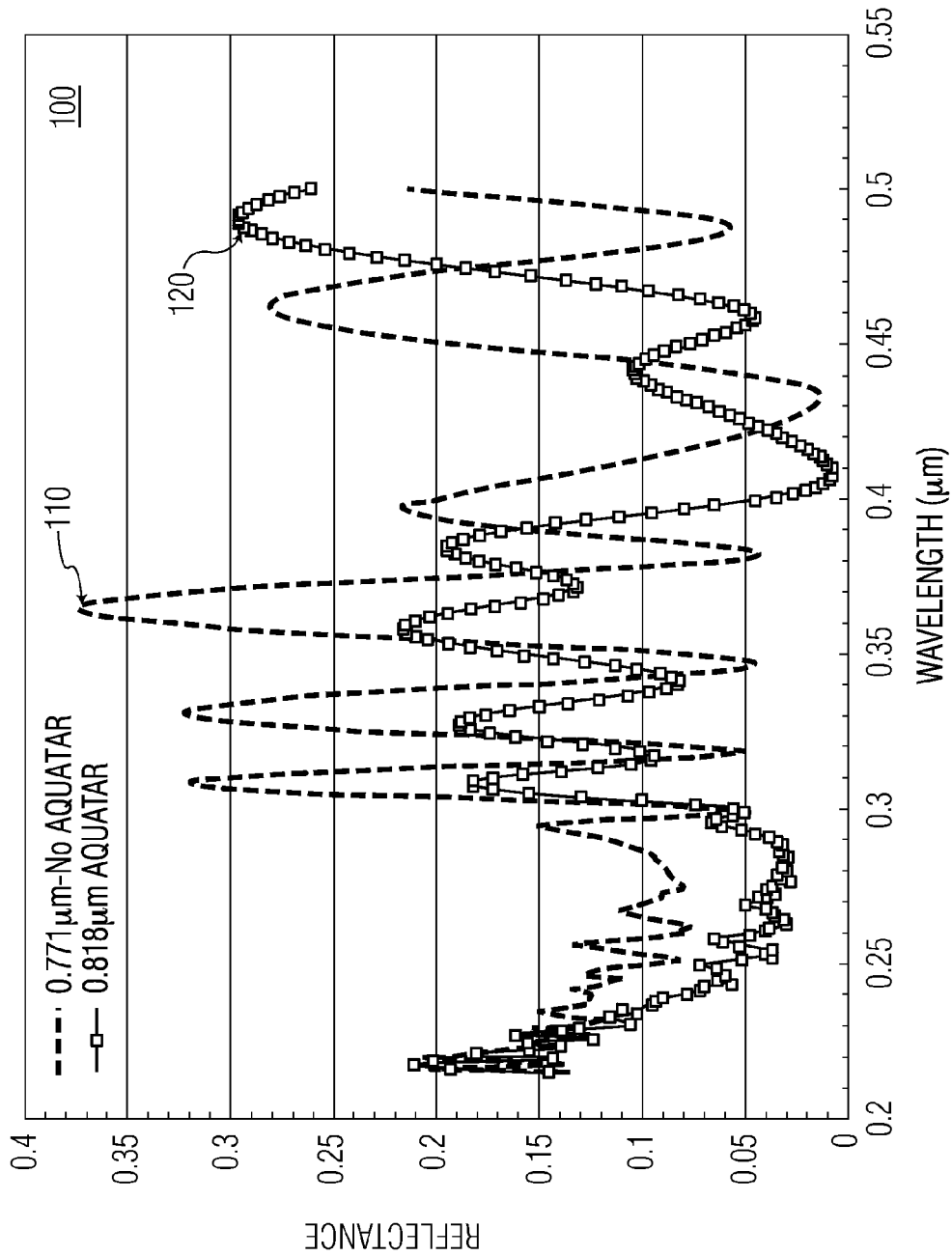
FIG. 1 illustrates UV reflectance spectra at extremes of desired resist thickness range for a poly buffer locus stack (silicon nitride/amorphous silicon/oxide/silicon)

FIG. 1 illustrates UV reflectance spectra of two resist films on a poly buffer LOCOS stack wafer (1600 Å SiN/500 Å amorphous silicon/300 Å $SiO_2$/silicon substrate). The first resist film disposed on the LOCOS stack wafer is SPR660® and has a thickness of 0.771 μm and is represented by curve 110. The second resist film is SPR6600® and has a thickness of 0.818 μm and is covered with Aquatar II®, which is a top anti-reflecting coating (TARC) that is designed to suppress standing waves, and is represented by curve 120. These resist films are exposed at an actinic wavelength of 365 nm in a lithographic process. The peaks and valleys, illustrated in FIG. 1, as a function of reflectance, are tabulated in Table 1 for the 0.771 μm film without TARC.

TABLE 1

Peak to valley ratio and reflectance for a 0.771 μm film without TARC.

| Peak/Valley | Reflectance |
|---|---|
| 0.309 | 0.320 |
| 0.318 | 0.050 |
| 0.330 | 0.324 |
| 0.347 | 0.045 |
| 0.364 | 0.375 |
| 0.382 | 0.044 |
| 0.397 | 0.217 |
| 0.433 | 0.014 |
| 0.462 | 0.280 |
| 0.487 | 0.057 |

Figure 2:
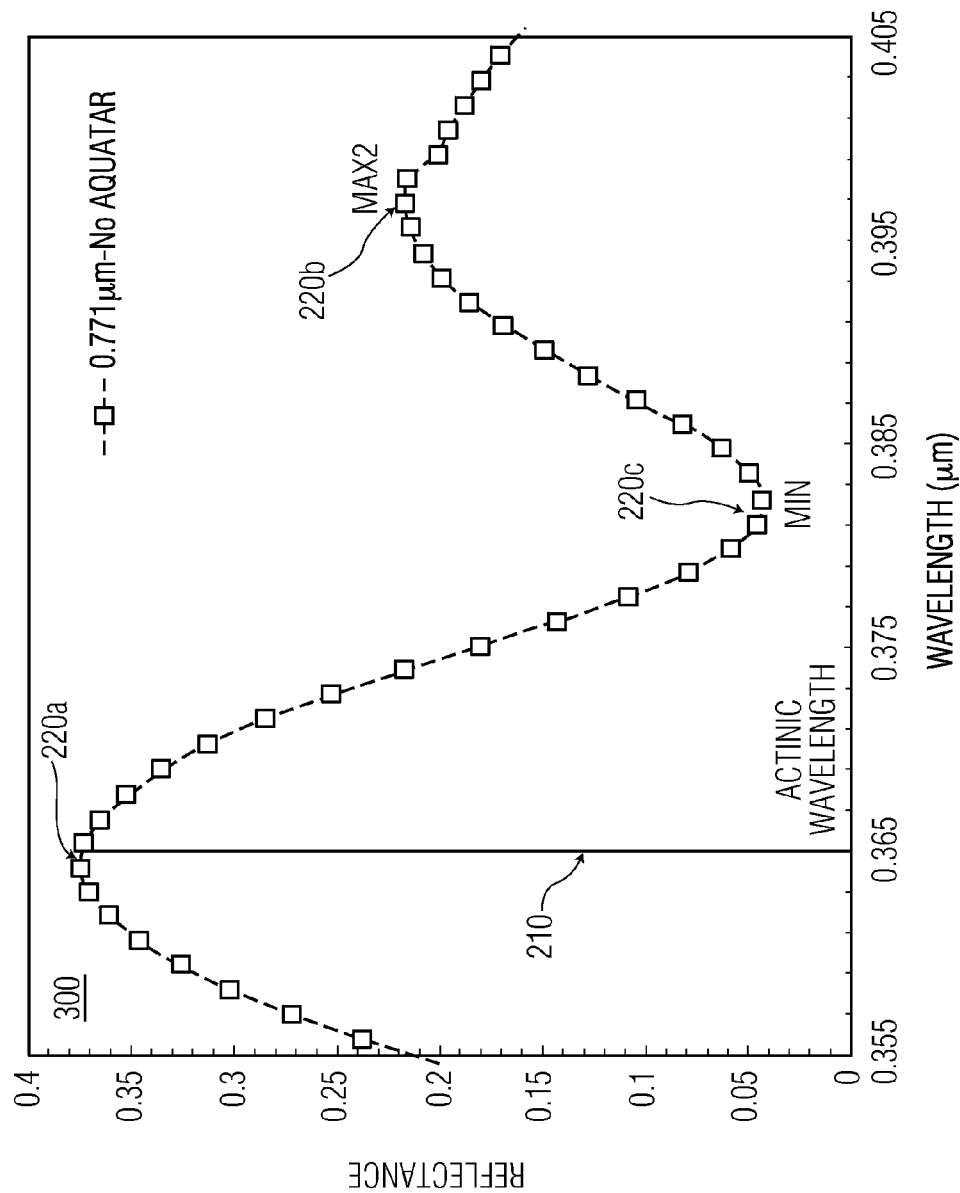
FIG. 2 illustrates a peak height and a minimum valley in the vicinity of an exposure wavelength for the poly buffer locus stack substrate.

Since the amplitudes of the spectra are not perfectly periodic due to substrate and other effects, the peak height is calculated as an average of nearby peaks. For the case when the actinic wavelength is nearest to a maximum or at a maximum, such as for the peak 220a shown in FIG. 2, the relative swing amplitude, Ar, is calculated using EQ. (1). $Max_1$ is represented by point 220a, $Max_2$ is represented by point 220b and $Min_1$ is represented by point 220c. The actinic wavelength is represented by point 210.

$$A_r = ((Max_1 + Max_2)/2 - Min_1)/2 \quad (1)$$

Alternatively, if the actinic wavelength is closest to a minimum than Equation (2) is used:

$$A_r = (Max_1 - (Min_1 + Min_2)/2)/2 \quad (2)$$

EQS. 1 and 2 are examples, and numerous other formulas for calculating of the relative swing amplitudes may envisaged without departing from the scope of the invention.

Table 2 summarizes the swing ratios for many wafers having various photoresist thicknesses with Aquatar® TARC.

TABLE 2

Swing ratios for many wafers having various photoresist thickness and a layer of Aquatar ® TARC

| File | Description | Thickness(um) | $A_r$ |
|---|---|---|---|
| 3924911.asc | Aquatar | 0.771 | 0.043 |
| 3925507.asc | Aquatar | 0.783 | 0.046 |
| 3925515.asc | Aquatar | 0.796 | 0.054 |
| 3925503.asc | Aquatar | 0.825 | 0.059 |
| 3925523.asc | Aquatar | 0.842 | 0.054 |
| 3924908.asc | Aquatar | 0.861 | 0.048 |
| 3925511.asc | Aquatar | 0.880 | 0.042 |
| Average | | | 0.050 |

Table 3 summarizes the swing ratios for many wafers having various photoresist thickness without Aquatar® TARC.

TABLE 3

Swing ratios for many wafers having various photoresist thickness without a layer of Aquatar ® TARC

| File | Description | Thickness(um) | $A_r$ |
|---|---|---|---|
| 3924901.asc | No Aquatar | 0.771 | 0.165 |
| 3925505.asc | No Aquatar | 0.783 | 0.150 |
| 3925513.asc | No Aquatar | 0.796 | 0.141 |
| 3925525.asc | No Aquatar | 0.811 | 0.141 |
| 3925501.asc | No Aquatar | 0.825 | 0.138 |
| 3924905.asc | No Aquatar | 0.861 | 0.147 |
| 3925509.asc | No Aquatar | 0.880 | 0.136 |
| 3925517.asc | No Aquatar | 0.897 | 0.135 |
| Average | | | 0.141 |

From Tables 2 and 3 it is evident that the swing ratio calculation is relatively independent of resist thickness but depends on whether Aquatar® TARC is used.

A swing reduction ratio, $S_r$, is calculated from the UV spectra as follows:

$$S_r = (A_r^{NoAquar} - A_r^{Aquatar})/A_r^{NoAquatar} \quad (3)$$

Alternatively, the swing reduction ratio Sr' determined from experimental or other modeling:

$$S_r = ((CD^{Max} - CD^{Min})^{NoAquatar} - (CD^{Max} - CD^{Min})^{Aquatar})/(CD^{Max} - CD^{Min})^{NoAquatar} \quad (4)$$

The method in accordance with the embodiment of the invention allows the linewidth variation with resist thickness to be calculated from two wafers without having to perform line width measurements.

Figure 3:
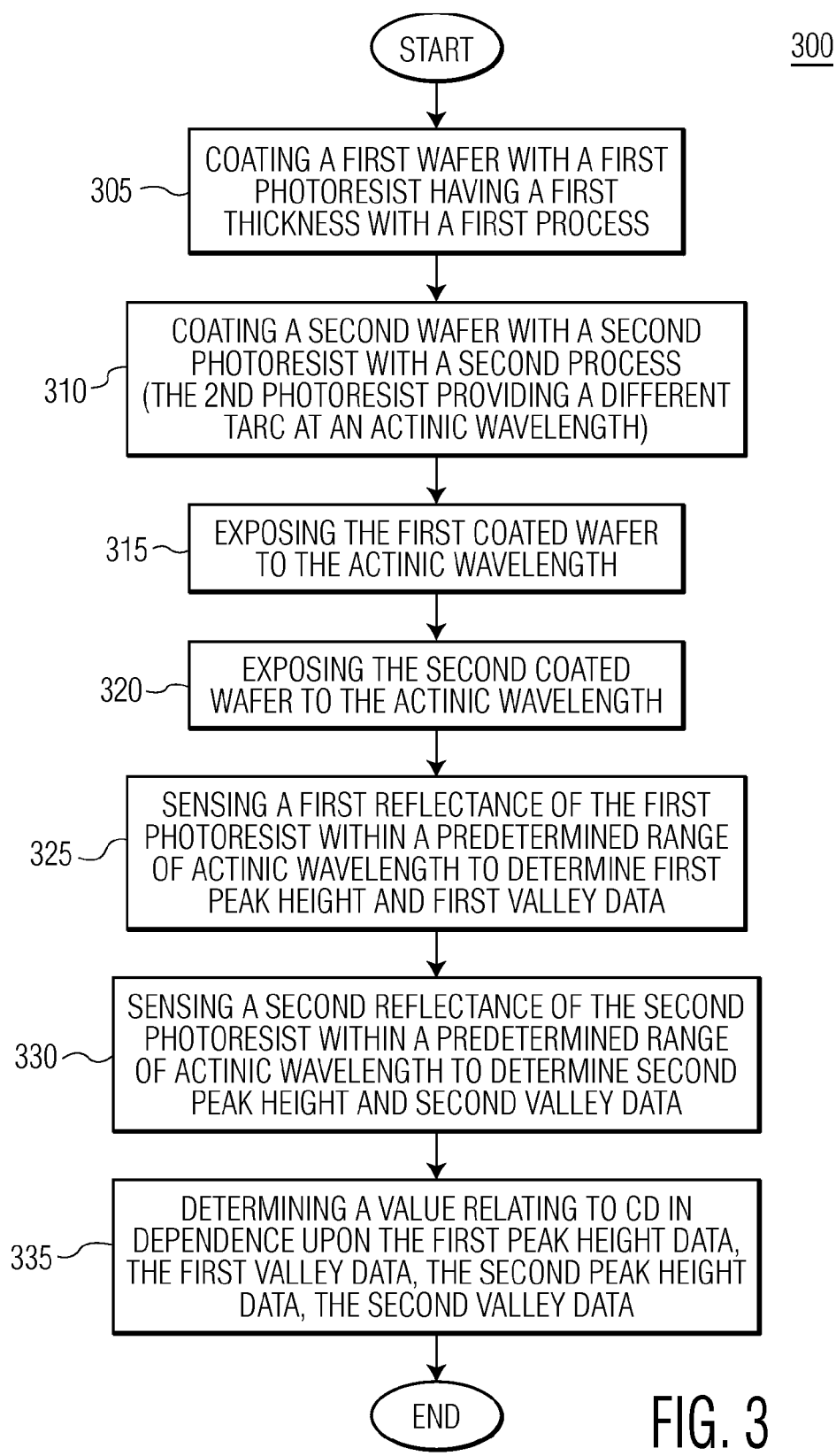
FIG. 3 summarizes processing steps for determining the critical dimensions (CD).

Referring to FIG. 3, processing steps are summarized for determining the CD. In step 305, a first wafer is coated with a first photo resist having a first thickness in accordance with a first process. A second wafer is coated with a second photo resist having a second thickness in accordance with a second process, the second photo resist for providing different a top antireflective coating at an actinic wavelength, in step 310. The first coated wafer is then exposed to the actinic wavelength, in step 315. In step 320, the second coated wafer is exposed to the actinic wavelength. Sensing a first reflectance of the first photo resist within a predetermined range of the actinic wavelength to determine first peak height data and first valley data is performed in step 325. Sensing a second reflectance of the second photo resist within a predetermined range of the actinic wavelength to determine second peak height data and second valley data, takes place in step 330. Finally, in step 335, a value relating to CD is determined in dependence upon the first peak height data, the first valley data, the second peak height data and the second valley data.

Referring to Table 4, a summary of swing curve reduction ratios is shown when the process steps outlined in FIG. 3 are executed.

TABLE 4

Summary of swing curve reduction ratios.

|  | Swing Reduction |
| --- | --- |
| Spectra | (0.141-0.050)/0.141 = .33 |
| CD Measurements | (0.033-0.019)/0.033 = .21 |

While the present invention has been described with reference to several particular example embodiments, those skilled in the art will recognize that many changes may be made thereto without departing from the spirit and scope of the present invention, which is set forth in the following claims.

What is claimed is:

1. A method of determining relative swing curve amplitudes for a plurality of wafer processes comprising the steps of:
coating a first wafer with a first photo resist having a first thickness in accordance with a first process;
coating a second wafer with a second photo resist having a second thickness in accordance with a second process, the second photo resist for providing different a top antireflective coating at an actinic wavelength;
exposing the first coated wafer to the actinic wavelength;
exposing the second coated wafer to the actinic wavelength;
sensing a first reflectance of the first photo resist within a predetermined range of the actinic wavelength to determine first peak height data and first valley data;
sensing a second reflectance of the second photo resist within a predetermined range of the actinic wavelength to determine second peak height data and second valley data; and
determining a value relating to critical dimension (CD) as a function of the first peak height data, the first valley data, the second peak height data and the second valley data.

2. The method according to claim 1 wherein the step of sensing further comprises a step of measuring.

3. The method according to claim 1 wherein the step of exposing comprises the step of directing from source of actinic light within a predetermined range of wavelengths and other than a source of approximately white light.

4. The method according to claim 1 wherein the step of determining comprises the steps of computing a first relative swing ratio using the first peak height data and the first valley data.

5. The method according to claim 2 wherein the step of determining comprises the steps of computing a second relative swing ratio using the second peak height data and the second valley data.

6. The method according to claim 2 comprising the step of comparing the first relative swing ratio to the second relative swing ratio to determine which provides critical dimension control within predetermined limits.

7. A method of determining relative swing curve amplitudes for a plurality of wafer processes comprising the steps of: coating a first wafer with a first photo resist having a first thickness in accordance with a first process; coating a second wafer with a second photo resist having a second thickness in accordance with a second process, the second photo resist for providing different optical characteristics that the first photo resist at an actinic wavelength; exposing the first coated wafer to the actinic wavelength; exposing the second coated wafer to the actinic wavelength; sensing a first reflectance of the first photo resist within a predetermined range of the actinic wavelength to determine first peak height data and first valley data; sensing a second reflectance of the second photo resist within a predetermined range of the actinic wavelength to determine second peak height data and second valley data; and determining a relative swing ratio for the first and second processes in dependence upon the first peak height data, the first valley data, the second peak height data and the second valley data.

8. The method according to claim 7 wherein the step of sensing comprising a step of measuring.

9. The method according to claim 7 wherein the step of exposing comprises the step of directing from source of actinic light within a predetermined range of wavelengths and other than a source of approximately white light.

10. The method according to claim 7 wherein the step of determining comprises the steps of computing a first relative swing ratio using the first peak height data and the first valley data.

11. The method according to claim 10 wherein the step of determining comprises the steps of computing a second relative swing ratio using the second peak height data and the second valley data.

12. The method according to claim 10 comprising the step of comparing the first relative swing ratio to the second relative swing ratio to determine which provides critical dimension control within predetermined limits.

13. The method according to claim 7 wherein the second photo resist comprises TARC.

14. The method according to claim 7 wherein the actinic wavelength is an ultraviolet wavelength.

15. The plurality of wafers manufactured in accordance with the method of:
coating a first wafer with a first photo resist having a first thickness in accordance with a first process;
coating a second wafer with a second photo resist having a second thickness in accordance with a second process, the second photo resist for providing different a top antireflective coating at an actinic wavelength;

exposing the first coated wafer to the actinic wavelength;
exposing the second coated wafer to the actinic wavelength;
sensing a first reflectance of the first photo resist within a predetermined range of the actinic wavelength to determine first peak height data and first valley data;
sensing a second reflectance of the second photo resist within a predetermined range of the actinic wavelength to determine second peak height data and second valley data; and
determining a value relating to critical dimension (CD) as a function of the first peak height data, the first valley data, the second peak height data and the second valley data.

* * * * *